United States Patent [19]

Ito et al.

[11] 4,016,829
[45] Apr. 12, 1977

[54] APPARATUS FOR CRYSTAL GROWTH

[75] Inventors: Kazuhiro Ito; Yuichi Ono; Kiichi Ueyanagi, all of Hachioji; Makoto Morioka; Masao Kawamura, both of Tokyo, all of Japan

[73] Assignee: Hitachi, Ltd., Japan

[22] Filed: Feb. 26, 1974

[21] Appl. No.: 445,898

[30] Foreign Application Priority Data

Feb. 26, 1973 Japan .............................. 48-22072

[52] U.S. Cl. .................................. 118/64; 118/412; 118/415; 118/421; 118/426; 156/622; 148/171

[51] Int. Cl.² ........................................ B01J 17/04

[58] Field of Search ...... 23/273 SP, 301 SP, 301 R; 164/60, 80; 156/605, 622; 148/171, 172; 118/425, 426, 422, 58, 64, 412, 415, 115, 421, 110, 114; 427/86, 87

[56] References Cited

UNITED STATES PATENTS

| 3,560,276 | 2/1971 | Panish | 23/273 SP |
|---|---|---|---|
| 3,565,702 | 2/1971 | Nelson | 156/605 |
| 3,598,169 | 8/1971 | Copley | 164/60 |
| 3,631,836 | 1/1972 | Jarvela | 118/415 |
| 3,647,578 | 3/1972 | Barnett | 156/621 |
| 3,665,888 | 5/1972 | Bergh | 23/273 SP |
| 3,692,592 | 9/1972 | Marinelli | 156/622 |
| 3,741,825 | 6/1973 | Lockwood | 118/415 |
| 3,762,943 | 10/1973 | Winstel | 23/273 SP |
| 3,767,481 | 10/1973 | Ettenberg | 118/415 |
| 3,783,825 | 1/1974 | Koboyasi | 23/273 SP |
| 3,895,765 | 7/1975 | Ariga | 118/415 |

OTHER PUBLICATIONS

Blum et al., IBM Tech. Disclosure Bulletin, vol. 13, No. 11, Apr. 1971, p. 3221.

Primary Examiner—Stephen J. Emery
Attorney, Agent, or Firm—Craig & Antonelli

[57] ABSTRACT

In order to eliminate non-uniformity in the temperature within the plane of a substrate that causes dispersions or variations in the characteristics of a grown layer during liquid phase epitaxial growth and to produce a grown layer having uniform characteristics, an apparatus for crystal growth according to the invention holds a substrate on a jig so that a flat surface of the substrate is arranged tangentially to an isothermal plane within the jig and aslant with respect to any position perpendicular or parallel to the axis or the center plane of the jig. Where a multiplicity of substrates are set, they are held on at least two flat surfaces which are tangential to an identical isothermal plane and which have different slopes.

12 Claims, 20 Drawing Figures

APPARATUS FOR CRYSTAL GROWTH

BACKGROUND OF THE INVENTION

1. Field of the Invention

The present invention relates to crystal growth apparatus for growing a semiconductor crystal on a substrate in the liquid phase within a reactor which has a temperature gradient along its axis.

2. Description of the Prior Art

Needless to say, it is the most important in the semiconductor industry to fabricate semiconductor elements of good characteristics at a high yield. As regards the manufacturing step of epitaxially growing a semiconductor crystal, this is equivalent to precisely bestowing uniform thicknesses, carrier impurity concentration profiles, composition profiles etc. on all the parts of a layer epitaxially grown on a substrate crystal.

It is well known that the most serious cause which brings a dispersion or variation to the grown layer in the liquid phase epitaxial growth of the semiconductor crystal is non-uniformity in the temperature within the plane of the substrate. In, for example, the liquid phase epitaxial growth of $GA_{(1-x)}Al_xAs$ (where x denotes the mixed ratio and $0<x<1$), the non-uniformity in the substrate temperature gives rise to non-uniformity in the thickness of the grown layer and also to non-uniformity in the mixed ratio x. Where the material is used for LED's (light emitting diodes), the emission wavelength is dispersed among the diodes.

As another example, where it is intended to obtain by the liquid phase epitaxial growth of GaAs a multi-layer which has layers of different impurity concentration levels, the non-uniformity in the substrate temperature gives rise to non-uniformity in the thickness of each constituent layer and also to non-uniformity in the impurity concentration. Both these non-uniformities impart dispersions or variations in the characteristics of the semiconductor elements, and lower the yield of the fabrication of the elements.

As understood from the above explanation, to the end of fabricating the semiconductor elements in a good yield, it is very important to eliminate the non-uniformity in the substrate temperature in case of employing epitaxial growth.

The non-uniformity in the temperature within the substrate plane as stated above is generated by various causes. One of them is an arrangement of the substrate that ignores the effect of the shape of a jig. An example of such arrangement will now be described in connection with an apparatus of the so-called "vertical type" among growth apparatus of the sliding type. The apparatus comprises a quartz reactor which is assembled in the middle of an electric furnace shaped as a hollow cylinder, and a graphite jig which is set in the quartz reactor. The upper part of the graphite jig is a slider portion which, having received a solution therein, is rotated by a rod so that it can bring the substrate and the solution into contact with each other. On the other hand, the lower part of the jig is a fixed portion which holds the substrate and which is fixed by a tube made of quartz glass. In such apparatus, it is common knowledge to arrange the substrate so that its surface may become perpendicular to the axis of the reactor. The temperature within the jig in such apparatus, however, is so distributed that the temperature is high at the outside surface of the jig close to the furnace wall and so that the temperature becomes lower in coming nearer to the central part of the jig. For this reason, the temperature within the substrate plane is naturally distributed in a non-uniform manner.

In the furnace which has a uniform temperature along its axis, isothermal planes will be represented by concentric cylinders which have substantially the same axis. Also, in the reactor which has a temperature gradient along its axis, as regards the temperature distribution in one plane perpendicular to the axis, the temperature is high at the outside surface of the jig close to the furnace wall, and it becomes lower as the central part of the jig is approached. Isothermal planes within the jig in that case are upwardly convex. It is therefore natural that where the substrate is arranged so as to become perpendicular to the axis of the reactor (or the axis of the jig), the non-uniformity in the temperature arises within the plane of the substrate.

The specific dispersions or variations in the grown layer which are, as previously stated, ascribable to the non-uniformity in the temperature are particularly intense in case of the epitaxial growth which requires a thickness as large as several hundreds $\mu m$ for the grown layer, e.g. 200 $\mu m$. Due to influences of these dispersions, the yield in the fabrication of the semiconductor elements becomes conspicuously inferior.

As a second example of the arrangement of the substrates which lead to the generation of the non-uniformity in the substrate temperature due to the effect of the shape of a growing jig, description will now be made of an apparatus of the so-called "lateral type" among the growth apparatus of the sliding type. The apparatus comprises a square reactor of quartz glass which is assembled in an electric furnace, and a growing jig of graphite which is set in the reactor. The upper part of the graphite jig is a slider portion which, having received therein a solution for the growth, is moved by a rod. The lower part of the jig is a fixed portion which holds the substrates.

In such apparatus, it is well known that the substrate is arranged so as to become parallel to the center plane of the reactor, that is, the plane of the contact between the slider and the fixed portion. Where the jig is heated by the use of the electric furnace, non-uniformity in the temperature within the jig as explained in the first example of a growth apparatus arises also in the present example. Where a temperature gradient is established in the vertical direction of the jig, non-uniformity in the temperature arises likewise.

Where the substrates are arranged in parallel with the horizontal axis of the reactor in such apparatus, the non-uniformity in the temperature within the substrate plane is naturally caused in many positions. Also, in this case, the characteristics of the grown layer are dispersed or varied by the non-uniformity in the temperature, and hence, the yield in the fabrication of the elements is degraded.

SUMMARY OF THE INVENTION

An object of the present invention is to provide an apparatus for crystal growth which eliminate non-uniformity in the temperature within a substrate plane that imparts dispersions or variations to the characteristics of a grown layer in the liquid phase epitaxial growth and which can thus produce a grown layer having uniform characteristics.

In order to accomplish the above object, according to the present invention, a substrate is held by a jig so that it has a flat surface arranged along and in particular tangentially to an isothermal plane within the jig and preferably at a position inclined from a position perpendicular or parallel to the axis or the center plane of the jig. In case of using a plurality of substrates, they are held on at least two flat surfaces which are tangential to an identical isothermal plane and which have different inclinations.

While the present invention will be hereunder described more in detail along its preferred embodiments with reference to the accompanying drawing, it is to be understood that these embodiments are for exemplification and not restrictive and that the invention can have various modifications and improvements without departing from the scope and spirit thereof.

BRIEF DESCRIPTION OF THE DRAWING

FIG. 2b is a diagram of a temperature distribution within the jig of the apparatus shown in FIG. 2a;

FIG. 3b is a plan view of the apparatus illustrated in FIG. 3a;

FIG. 3c is a diagram of a temperature distribution within the jig of the apparatus illustrated in FIG. 3a;

FIG. 4 is a perspective view showing a modification of the apparatus illustrated in FIG. 3a;

FIG. 11 is a plan view of an apparatus, which is a modification of that illustrated by FIGS. 3a and 3b and a sectional view of which is identical to FIG. 3a;

FIG. 12 is a perspective view of a horizontal type sliding crystal growth apparatus, a section of which is illustrated by FIG. 9a.

DESCRIPTION OF THE PREFERRED EMBODIMENTS

Example 1

Figure 1:
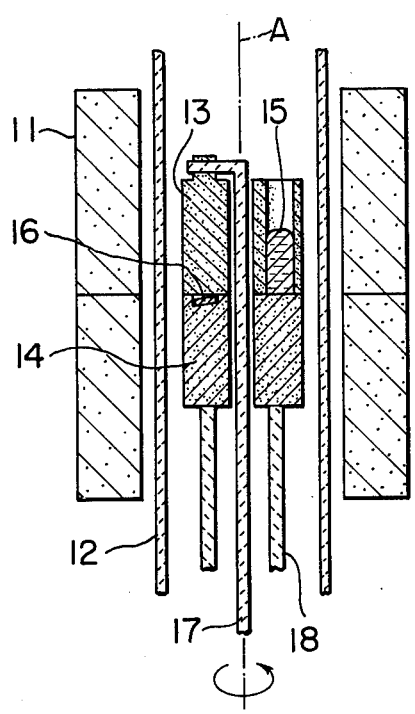
FIG. 1 is a sectional view of a vertical type sliding crystal growth apparatus according to the present invention that includes a graphite jig mounted in the middle of an electric furnace having hollow cylinder shape.

FIG. 1 is a sectional view of a vertical type sliding crystal growth apparatus. It comprises a reactor of quartz glass 12 which is assembled in the middle of an electric furnace of hollow cylinder shape 11, and which defines a chamber and a jig of graphite which consists of an upper ring-shaped part 13 and lower ring-shaped part 14 and which is set in the reactor chamber. The upper part 13 of the graphite jig receives a solution 15 in a reservoir provided therein, and can be rotated by the use of a rod 17 in order to bring the solution 15 into contact with a substrate 16 positioned on the lower part 14. The lower part 14 of the graphite jig is fixed and supported by a tube of quartz glass 18. The substrate 16 placed on the fixed portion 14 is arranged aslant so as to extend tangentially to an isothermal plane within the jig as previously explained.

More specifically, in the case of the prior art, the substrate is located at the position perpendicular to the axis A of the jig; whereas in the method according to the present invention, the substrate is located at an angle other than the right angle to the axis of the jig. Owing to such an arrangement of the substrate, the uniformity in the temperature within the plane of the substate is remarkably enhanced, and the uniformity in the characteristics of a grown layer becomes good.

The angle of inclination at which the substrate is held can really be determined by embedding a number of temperature sensors in the graphite jig and directly measuring the temperature distribution. It serves the purpose, however, to induce the liquid phase growth for trial at a number of points on the fixed portion of the jig and to consider that the temperature is equal at the points having the same growth rate, because the growth rate of a layer growing on the substrate is greater as the temperature is lower.

Figure 2A:
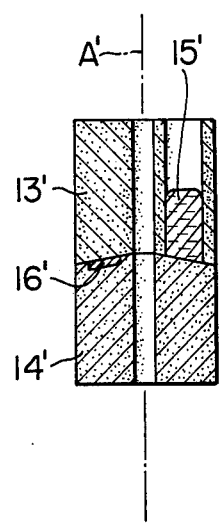
FIG. 2a is a sectional view showing a modification of the apparatus illustrated in FIG. 1.
Figure 2B:
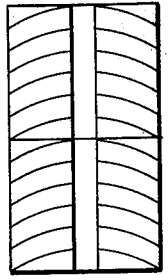

FIG. 2a is a view for illustrating a modification of the jig described with reference to FIG. 1 and FIG. 2b illustrates the positioning of the isothermal planes within the apparatus of FIG. 2a. While the substrate 16' held in the jig is located tangentially to an isothermal plane within the jig as is in FIG. 1, the contact plane between a slider portion 13' and a fixed portion 14' is inclined at the same slope as that of the substrate. The significance of this measure is hereinafter described. Since the jig in FIG. 1 has an unnecessary space between the upper surface of the substrate 16 and the slider portion 13, the solution for the growth 15 cannot be well separated from the grown surface after the growth. Although the modification of FIG. 2 does not perfectly eliminate the disadvantage, it makes improvements in this respect.

Using the apparatus explained above with reference to FIG. 1 or FIG. 2, the growth of $Ga_{(1-x)}Al_xAs$ (Where $x$ denotes the mixed ratio and $1 > x > 0$) was carried out. The jig parts 13 or 13' and 14 or 14' at this time were cylinders of graphite each having a diameter of 80 mm. and a height of 90 mm. Each cylinder was formed at its center with a hole of a diameter of 10 mm., through which the rod 17 was inserted as shown in FIG. 1. The substrate 16 or 16' was placed on the upper surface of the fixed portion 14 or 14' of the jig so as to define an inclination of 8 degrees with respect to the axis A or A' in the jig. The substrate herein used was the {100} plane of GaAs, which was 300 μm thick and a 15 × 15 mm square. On the other hand, as the solution for the growth 15 or 15', 20 g. of Ga, 3 g. of GaAs and 0.05 g. of Al were employed and put into the reservoir of slider portion 13 or 13' of the jig. These constituents were set as illustrated in FIG. 1. The interior of the reactor was filled with $H_2$. Thereafter, The electric furnace was raised in temperature, and a temperature gradient was established so that the vicinity of the substrate 16 or 16' might become 900° C and that a place higher by 1 cm than the substrate might become 930° C. After the jig was held in this state for 30 minutes, the slider portion 13 or 13' was rotated with the rod so as to bring the solution 15 or 15' and the substrate 16 or 16' into contact with each other. With the temperature gradient kept, the temperature of the substrate 16 or 16' was cooled from 900° C to 800° C slowly at 5° C/hr. The slider portion 13 or 13' was again rotated by means of the rod. After being cooled down to the room temperature, the substrate 16 or 16' was taken out. Then a grown layer of $Ga_{(1-x)}Al_xAs$ being 700 μm × 30 μm thick was produced on the whole area of the substrate. According to the X-ray microanalysis, the composition of this crystal along its vertical section was $Ga_{0.6}Al_{0.4}As$ at a part close to the substrate, and exhibited gentle curve changes towards $Ga_{0.9}Al_{0.1}As$ at a part close to the surface of the grown layer. The changes are attributed to the segregation of Al.

In contrast, where the substrate was arranged so as to define the angle of 90° to the axis of the jig as in the prior art, a grown layer produced under the same growing conditions as mentioned above was dispersed or varied by 400 μm ± 200 μm in thickness, and the thickness was smallest at a part closest to the wall of the reactor and largest at a part closest to the axis of the jig. This can be readily understood from the state of the temperature distribution within the jig as explained before. From the foregoing facts, it will be recognized that the method according to the present invention is very effective.

EXAMPLE 2

Figure 3A:
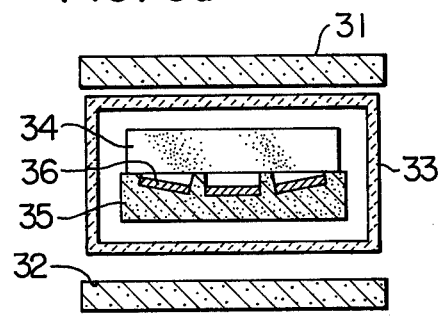
FIG. 3a is a sectional view of a horizontal type sliding crystal growth apparatus according to the present invention that includes heat sources at the upper and lower parts.
Figure 3B:
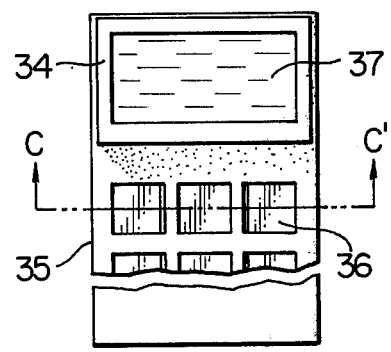
Figure 3C:

FIG. 3a is a sectional view of a horizontal type sliding crystal growth apparatus. It comprises a square reactor of quartz glass 33 which is assembled between flat plate-like heat sources 31 and 32, and a growing jig of graphite which consists of an upper part 34 and a lower part 35 and which is set in the reactor. FIG. 3b is a plan view of the apparatus shown in FIG. 3a, with elements 31 and 33 being omitted, and the sectional view if FIG. 3a is taken along a line C — C' in FIG. 3b. The upper part 34 of the jig receives a solution 37 for the growth therein, and can be slid on the lower jig 35 through a rod (not shown). The lower part 35 of the jig is fixed, and holds substrates 36. FIG. 3c is a diagram showing the temperature distribution within the jig parts 34 and 35 in the case where a temperature gradient is established in which the temperature lowers from the upper jig part 34 towards the lower jig part 35. Each curve in the diagram is an isothermal line.

The substrates 36 set in the jig in FIG. 3a may be arranged along any isothermal line in the lower part 35 of the jig in FIG. 3c. Naturally, the substrates 36 are not always parallel to the center plane B of the jig (in this case, the center plane is made coincident with the contact plane between the slider portion 34 and the fixed portion 35), and are arranged at inclined positions. This means that a plurality of substrates are held on at least one plane. Thus, the uniformity in the temperature within the plane of the substrates is enhanced, the dispersions or variations in the characteristics of a grown layer are consequently avoided, and the yield in the fabrication of semiconductor elements can be raised.

Using the growing jig described with reference to FIGS. 3a, 3b and 3c, the growth of GaAs was carried out. There were used three GaAs substrates, each of which was a crystal of the {111} B plane having an area of 20 mm × 20 mm and a thickness of 400 μm. Each of the jig parts 34 and 35 had a width of 100 mm and a thickness of 25 mm, the jig part 34 had a length of 40 mm, and the jig part 35 had a length of 80 mm. The central substrate 36 was located in parallel with the center plane B of the growing jig and at 2mm below the contact plane between the parts 34 and 35 of the jig. The two substrates 36 on both sides were located so as to have an inclination of approximately 5° and to extend tangentially to an isothermal line within the jig as shown in FIG. 3c. 100 g. of Ga, 25 g. of GaAs and 10 mg. of Te were put in the reservoir of part 34 as the solution for the crystal growth.

These elements of the jig assembly were placed in the reactor 33, from which air was perfectly discharged by $H_2$-gas. The apparatus thus set was heated by the electric furnace. The furnace 31 over the reactor was maintained at 950° C. and the furnace 32 under it was maintained at 850° C. so that the temperature of the substrates 36 might become 900° C. and that a temperature gradient of approximately 2° c/cm might be established in the vertical direction thereof. After the temperatures of the furnaces were held for 1 hour, the slider portion or upper portion 34 was moved to bring the solution for the growth and the substrates into contact. Then, the substrates were cooled down to 800° C at a rate of about 0.2° C/min. After the cooling, the slider portion 34 was again moved to cut off the contact between the substrates and the solution. After cooling down to the room temperature, the substrates were taken out of the reactor. A grown GaAs layer on any substance thus produced had the characteristics of a thickness of 400 μm ± 20μm and an impurity concentration of $2 \times 10^{17}$ cm$^{-3}$ ± $0.5 \times 10^{17}$ cm$^{116\ 3}$.

On the other hand, where the jig not conforming to the foregoing method of the present invention was used, two grown layers on the right and left sides as do not extend tangentially to the isothermal line were dispersed as 400 μm ± 80 μm in the thickness and as 1 to $3 \times 10^{17}$ cm$^{-3}$ in the impurity concentration. It is accordingly understood that the apparatus and method of the present invention can produce highly uniform grown layers.

EXAMPLE 3

Figure 4:
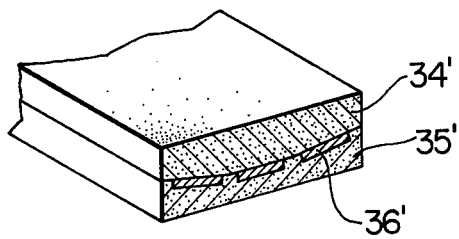

FIG. 4 shows a modification of the growing jig in FIG. 3a. Although the modifications has a lower jig part 35' similar to part 35 in FIG. 3a, the respective parts of the bottom of a slider or upper portion 34' are made polyhedral so as to become parallel with the surfaces of substrates 36'. The significance of this arrangement is the same as in the case of the apparatus shown in FIG. 2.

Using the jig shown in FIG. 4, the growth of GaP was carried out. The difference of this jig from the jig in FIG. 3a is the polyhedral configuration by which each of the three substrates 36' situated along an isothermal line within the jig becomes parallel to the lower surface of the slider portion 34' and the upper surface of the fixed part 35'. Thus, the separation between the grown layers and the solution at the time of the completion of the growth can be perfectly effected. The inclinations of the substrates and the dimensions of the jig parts were substantially the same as in Example 2. 100 g. of Ga, 1 g. of GaP and 20 mg. of Te were put in the slider portion 34' and made the solution for the growth. The 111 Bplane of GaP was used as eah substrate of GaP.

These elements of the jig assembly were set in the reactor, the interior of which has air discharged fully by $H_2$-gas. Thereafter, the apparatus was heated by the electric furnace as shown in FIG. 3a. The furnace over the reactor was maintained at 920° C, and the furnace under it was maintained at 900° C. so as to render the temperature of the substrates 880° C. and to establish a temperature gradient of 1° C/cm. in the vertical direction thereof. After the temperature were kept for 30 minutes, the slider portion 34' was moved to bring the substrates 36' and the solution for the growth into contact. The substrate temperature was lowered from 880° C to 850° C at 2° C/min. The slider portion 34' was subsequently moved to separate the grown layers and the solution. The grown GaP layers thus obtained on the respective substrates had the characteristics of a thickness of $10 \pm 0.5 \mu m$ and an impurity concentration of 7 to $7.5 \times 10^{17} cm^{-3}$.

In contrast, where the growth was made with a jig not conforming to the present invention, two grown layers on the right and left sides that do no extend along the isothermal line were dispersed by $10 \pm 2.5 \mu m$ in the thickness and by 5 to $8 \times 10^{17} cm^{-3}$ in the impurity concentration. From these facts, it is understood that grown layers having very uniform characteristics can be produced by the method according to the present invention.

EXAMPLE 4

Figure 5:
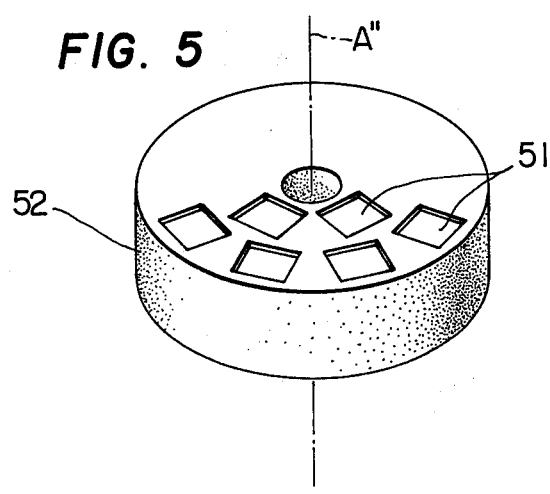
FIG. 5 is a sketch of a fixing jig in the vertical type sliding crystal growth apparatus according to the present invention.
Figure 10A:
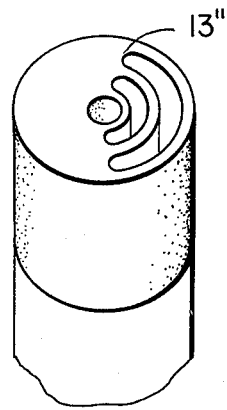
FIGS. 10a and 10b represent two sliding jigs useful for the type of fixing apparatus illustrated by FIG. 5.
Figure 10B:
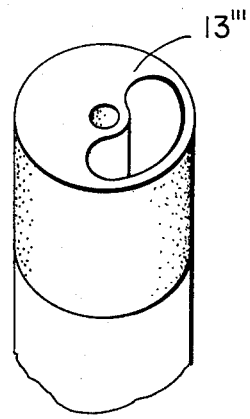
Figure 11:
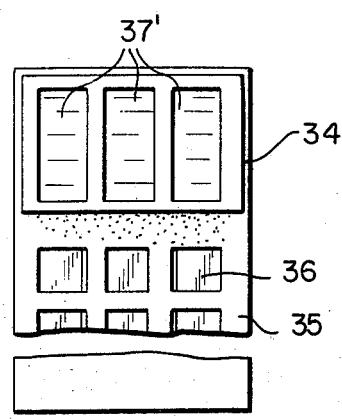

FIG. 5 relates to an embodiment in which the vertical type sliding crystal growth apparatus described with reference to FIG. 1 or FIG. 2 is so modified that the epitaxial growth can be performed on a multiplicity of substrates at one time. Shown in the figure is the lower jig portion 52 of such slider apparatus for fixing the substrates 51. That part of those parts of the slider at which the solution for the growth is received is formed into a large hole or are formed by increasing the number of the solution reservoirs as in the case of FIG. 1 or FIG. 2, and hence, they are omitted in FIG. 5. (FIGS. 10a and 10b illustrate these upper portions 13'' and 13'''. In FIG. 5, the substrates 51 are arranged so as to extend along an identical isothermal plane. The respective substrates are accordingly situated on different flat surfaces because the substrate surfaces are flat.

Using the apparatus explained above with reference to FIG. 5, the growth of $Ga_{(1-x)}Al_xAs$ was carried out. The jig 52 and the slider portion (not shown) at this time were cylinders of graphite each having a diameter of 150 mm. and a height of 90 mm. Each cylinder is formed at its center with a hole of a diameter of 10 mm., through which a rod (not shown) was inserted. The substrates were placed on the upper surface of the fixed portion 52. Among them, two belonging to an array close to the axis A'' of the jig defined an inclination of 8° with respct to the axis, while four belonging to the other array defined an inclination of 10°. Each substrate herein used was a crystal of the {100} plane of GaAs that was 300 $\mu m$ thick and has 15 × 15 mm.

square area. On the other hand, 20 g. of Ga, 3 g. of GaAs and 0.05 g. of Al were put in each of six holes of the slider portion as the solution for the growth. These constituent members were set likewise in the case of FIG. 1. The interior of the reactor was filled with $H_2$. The apparatus was heated by the electric furnace, and a temperature gradient was so maintained as to place the vicinity of the substrates 51 at 900° C and to render a part of the jig higher by 1 cm than the substrates at 930° C. After the apparatus was held in this state for 30 minutes, the slider portion was rotated with the rod so as to bring the solution and the substrates 51 into contact. As the temperature gradient was kept, the temperature of the substrates 51 was lowered from 900° C to 800° C slowly at 5° C/hr. The slider portion was again rotated by the rod. After cooling down to the room temperature, the substrates 51 were taken out. Then, grown layers of $Ga_{(1-x)}Al_xAs$ being $700 \pm 30 \mu m$ thick were obtained on all the substrates and over the entire substrate area.

In contrast, when the six substrates were arranged so as to define an angle of 90° to the axis as in the prior art, two of the grown layers obtained under quite the same growing conditions as mentioned above, the two being close to the axis of the jig, had a thickness of 400 $\mu m \pm$ 200$\mu m$, and the remaining four exhibited the dissolution of the substrates and had a thickness of 300 $\mu m \pm$ 300 $\mu m$. This can be easily understood from the state of the temperature distribution within the jig as heretofore explained. From the above facts, it will be appreciated that the method and apparatus according to the present invention are very effective. In this case, it is not essential that the number of the substrates in six. Needless to say, the shape of the contact plane between the slider portion and the fixed portion of the jig may be that in FIG. 1 or that in FIG. 2.

EXAMPLE 5

Figure 6A:
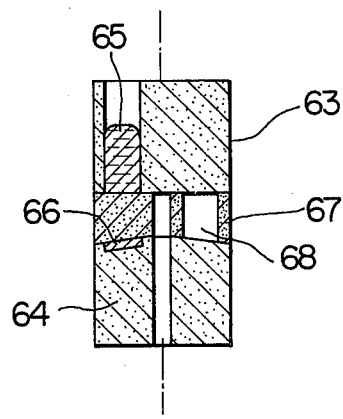
FIGS. 6a and 6b are sectional views of further embodiments of the graphite jigs in the vertical type sliding crystal growth apparatus according to the present invention.
Figure 6B:
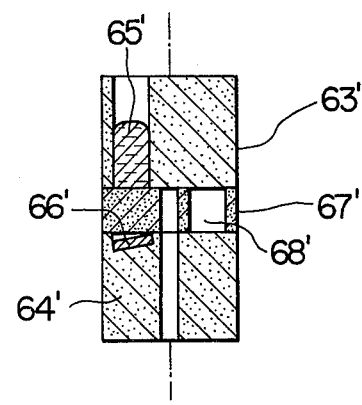

FIGS. 6a and 6b are sectional views of further embodiments of the vertical type sliding crystal growth apparatus. The apparatus comprises a lower part 64, 64' of the jig for fixing a substrate 66, 66', an upper part 63, 63' for receiving a solution for the growth 65, 65', and a middle part 67, 67' for performing the contact and separation between the solution 65, 65' and the substrate 66, 66'. The upper part 63, 63' and the lower part 64, 64' are respectively fixed, and the solution 65, 65' is located above the substrate 66, 66'. The middle part 67, 67' and the lower part 64, 64' have holes for inserting a rod (not shown), through which the middle part 67, 67' can be rotated. The middle part 67, 67' has a hole or bore 68, 68'. When the middle part 67, 67' is rotated to move the hole 68, 68' over the substrate 66, 66', the solution 65, 65' comes into contact with the substrate 66, 66'. Conversely, the substrate and the solution held in contact can be separated by further rotation. It is needless to say that the substrate 66, 66' is positioned so as to extend tangentailly to an isothermal line within the jig. The planes of the contact between the lower parts 64, 64' and the middle parts 67, 67' in FIGS. 6a, 6b are the same as in the cases of FIGS. 2 and 1, respectively, and hence further explanation of the mode of operation is omitted.

Using the apparatus in FIGS. 6a, 6b described above, the growth of $Ga_{(1-x)}Al_xAs$ was carried out (x being defined by $0 < x < 1$). The upper part 63, 63', the middle part 67, 67' and the lower part 64, 64' of the jig at this time had a diameter of 80 mm and heights of 90 mm, 10 mm and 90 mm, respectively. Since the conditions of growth were quite the same as explained in Example 1, only an outline is hereinafter presented.

When the same temperature and the same temperature gradient as in Example 1 were reached, the middle part 67, 67' of the jig was rotated by the rod, and the substrate 66, 66' and the solution 65, 65' were contacted. Similarly to Example 1, the substrate was cooled slowly. Subsequently, the middle part 67, 67' of the jig was again rotated by the rod. After cooling to the room temperature, the substrate 66, 66' was taken out. As the result, a grown layer of $Ga_{(1-x)}Al_xAs$ was obtained which was quite the same as in Example 1 in both the thickness and the mixed ratio.

In contrast, where the substrate was arranged so as to define the angle of 90° to the axis of the jig as in the prior art, the thickness of a grown layer obtained under the same growing conditions exhibited a dispersion or variation of 400 ±200 μm. A part close to the center of the jig was thick, while a part distant therefrom was thin. It is therefore understood that the method and apparatus according to the present invention are very effective. To be additionally emphasized here is that it is not essential that the apparatus shown in FIGS. 6a, 6b includes only one substrate. When the apparatus is so modified that a multiplicity of substrates can be handled at a time as in FIG. 5, quite the same result is achieved.

EXAMPLE 6

Figure 7A:
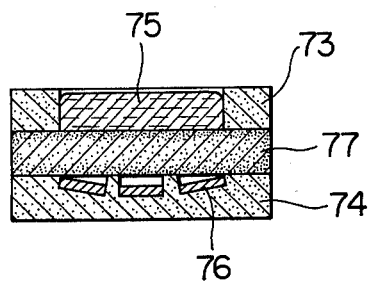
FIG. 7a and 7b are sectional views of further embodiments of a graphite jig in the horizontal type sliding crystal growth apparatus according to the present invention.
Figure 7B:
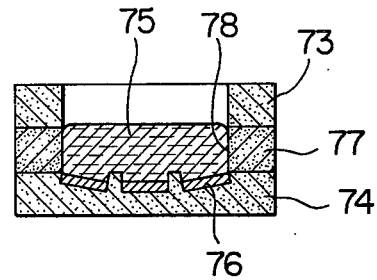

FIGS. 7a and 7b are sectional views of a further embodiment which is a modification of the apparatus in FIGS. 3a and 3b. A plurality of substrates 76 in FIG. 7a are situated tangentially to an isothermal line within the jig. A lower part 74 of the jig for fixing the substrates 76 and an upper part 73 for receiving a solution for the growth 75 are, respectively, fixed. Intermediate between the upper part 73 and the lower part 74 is a middle part 77, which is provided with a hole 78 for bringing the solution 75 and the substrates 76 into contact. By sliding the middle part 77 as shown in FIG. 7b outwardly from the plane of the drawing with the rod, the substrates 76 and the solution 75 can be contacted. Upon a reverse of the movement, the solution and the substrates can be separated.

Using the jig explained above with reference to FIGS. 7a and 7b, the growth of GaAs was carried out. The thickness of the middle part 77 of the jig employed was 10 mm and the other dimensions as well as growing conditions were the same as explained with reference to FIGS. 3a and 3b (Example 2), and hence, further description is not made. As in Example 2, the furnace over the reactor was maintained at 950° C. and the furnance under it at 900° C, and the apparatus was caused to stand for 1 hour. The middle part 77, of the jig was slid by the rod, to bring the solution for the growth and the substrates into contact. The substrates were cooled down to 800° C at a rate of 0.1° C/min. After the cooling, the middle part 77 was slid to cut off the contact between the substrates and the solution. After cooling to the room temperature, the substrates were taken out. Grown layers on the substrates thus obtained had the characteristics of a thickness of 400 ± 20μm and an impurity concentration of $2 \times 10^{17} \pm 0.5 \times 10^{17}$ cm⁻as in Example 2.

On the other hand, where the growth was carried out without adopting the present invention, two grown layers on the right and left sides of the jig that did not extend along the isothermal line were found to vary by 400 ± 80 μm in the thickness and by 1 to $3 \times 10^{17}$ cm$^{-3}$ in the impurity concentration. It is accordingly understood that the method and apparatus of the present invention can produce highly uniform grown layers.

EXAMPLE 7

Figure 8:
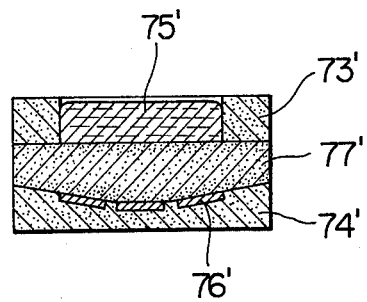
FIG. 8 is a sectional view of a still further embodiment of a graphite jig in the horizontal type sliding crystal growth apparatus according to the present invention.

FIG. 8 shows an embodiment of an apparatus wherein the jig shown in FIGS. 7a and 7b is modified. The modification is made to provide a sliding surface that is polyhedral so that the bottom surface of a middle part 77' and the upper surface of a lower part 74' may become parallel to the surfaces of substrates 76'. The significance is that the separation between the substrates and a solution 75' is effected more perfectly. Since the geometry other than stated above is the same as in FIG. 7a, further description has not been made.

GaP was grown by the use of the jig described with reference to FIG. 8. As in Example 3, 100 g of Ga, 1 g. of GaP and 20 mg. of Te were put in the upper part 73' of the jig and made the solution for the growth. As each substrate of GaP, a crystal of the {111}B plane of GaP was used.

These elements were set in the same reactor as in Example 3, and the temperature conditions, the procedures etc. were the same as in Example 3. Grown layers thus produced on the respective substrates had the characteristics of a thickness of 10 ± 0.5 μm and an impurity concentration of 7 to $7.5 \times 10^{17}$ cm$^{-3}$.

In contrast, where the growth was made with a jig not conforming to the present invention, two grown layers on the right and left sides as did not extend tangentially to the isothermal line were found to vary as much as 10 ± 2.5 μm in the thickness and as much as 5 to $8 \times 10^{17}$ cm$^{-3}$ in the impurity concentration. It is understood from these results that the apparatus and method according to the present invention can produce grown layers having characteristics of very good uniformity.

Figure 9A:
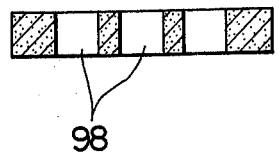
FIG. 9a and 9b show jigs which can be substituted for the inner part jigs in the graphite jigs illustrated in FIGS. 7a and 8, respectively.
Figure 9B:
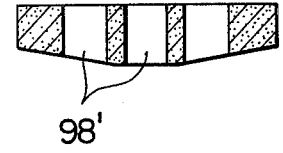
Figure 12:
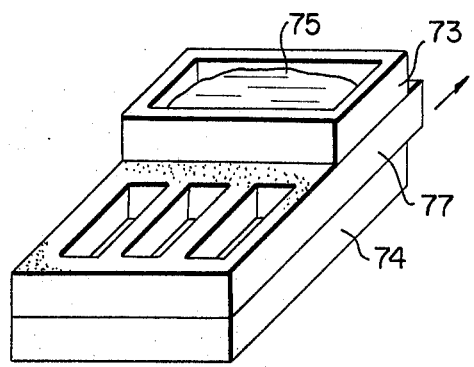
Figure 13:
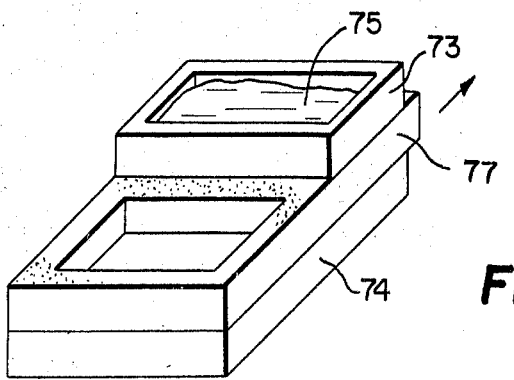
FIG. 13 is a perspective view of the apparatus shown in FIG. 7b.

FIGS. 9a and 9b show modifications of the middle part of the jig. The significance is that they have a plurality of holes 98, 98' for the solution that can overlie the individual substrates. With these jigs, the same results as obtained inthe cases of the use of the jigs in FIGS. 7a and 8 were, respectively, achieved. FIG. 12 is a perspective view of the apparatus of FIG. 4a.

As has thus far been described, according to the present invention, it is possible to eliminate the non-uniformity in the temperature within the substrate plane and to obtain grown layers having uniform characteristics, so that the yield of semiconductor elements can be enhanced. The apparatus and method according to the present invention is significant in that at least one substrate is disposed so as to extend tangentially to an isothermal plane within the jig. If the curved isothermal plane within the jig is convex, the substrate or substrates are disposed so as to extend above and tangentially to it, while if the same is concave, they are disposed below and tangentially to the isothermal plane. Needless to say, accordingly, the disposition of the substrate or substrates can be different from those in FIGS. 1 to 9b as explained previously. It is to be understood that the method according to the present invention is also applicable to the liquid phase crystal growth of substances other than mentioned in the examples, such as $GaAs_{1-x}P_x$, $Ga_{1-x}Al_xP$ and $In_{1-x}Ga_xP$. Further, it is apparent that it can also be utilized for different fields in which a heat treatment is executed, for example, the stage of work at which a metal or alloy for electrodes is bonded to a semiconductor crystal. The apparatus and method according to the present invention can enhance the yield of the fabrication of semiconductor elements and can therefore reduce the cost of the elements, so that the invention is an extraordinarily important technique in the semiconductor industry.

Moreover, it will be appreciated that in accordance with this invention the size of the substrates and arrangement thereof tangentially to the isothermal planes within the jigs are so selected that an acceptable variation in temperature in a given substrate of ± 5° C. is obtained.

While the novel principles of the invention have been described, it will be understood that various omissions, modifications and changes in these principles may be made by one skilled in the art without departing from the spirit and scope of the invention.

What we claim:

1. An apparatus for crystal growth in the liquid phase comprising:
    an electric furnace means for producing temperature differences vertically and for providing a plurality of isothermal curved planes vertically spaced from each other within said furnace;
    a reactor defining a chamber which is within and is heated by said electric furnace;
    a jig assembly means which is set in said reactor chamber and which includes an upper part and a lower part, the lower part being fixed and being arranged to hold on its upper surface a plurality of substrates, said lower part having means for positioning said substrates whereby a planar surface of each of said substrates on which the liquid phase crystal growth is to be made extends tangentially to an isothermal plane, said means for positioning said plurality of substrates including means for positioning the planar surface of at least one substrate aslant with respect to any position perpendicular or parallel to the vertical axis of said jig assembly means or to the center plane defined between the upper and lower parts of the jig assembly means, and the upper part having reservoir means for containing a solution for crystal growth; and
    control means to bring the solution for the growth in said reservoir means of said upper part into contact with said planar surface of each of said substrates and then to separate said solution and said planar surface.

2. The apparatus for crystal growth according to claim 1, wherein said upper part can slide on said lower part while being rotated and said control means comprises a control rod for rotating said upper part.

3. The apparatus for crystal growth according to claim 2, wherein the lower surface of said upper part is in contact with the surface of each substrate on which the liquid phase crystal growth is to be made, each substrate being held on said lower part, and when said upper part slides on said lower part, the separation of the growing solution from the grown surface after the crystal growth is effected by said upper part.

4. The apparatus for crystal growth according to claim 1, wherein said jig assembly means has a vertical axis and substantially cylindrical shape and includes a middle part disposed between said upper and lower parts, said upper part and said lower part being fixed relative to each other so that said reservoir means may overlie said substrates said control means including said middle part of said jig assembly means and a control rod for rotating said middle part, said middle part having at least one open passage extending vertically therethrough, the upper surface and lower surface of said middle part being, respectively, held in close contact with the lower surface of said upper part and the upper surface of said lower part, said upper surface of said middle part and another passage provided in said upper part forming the reservoir means in a position of the jig assembly means other than the position for the crystal growth, and said middle part being capable of rotating until said one open passage comes under the another passage forming said reservoir means, so that said solution for the growth in said reservoir means, falls down into said one passage and comes into contact with at least one substrate surface.

5. The apparatus for crystal growth according to claim 4, wherein the lower surface of said middle part is in contact with the surface of each substrate on which the liquid phase crystal growth is to be made, each substrate being held on said lower part, and when said middle part slides on said lower part, the separation of the growing solution from the grown surface after the crystal growth is effected by said middle part.

6. The apparatus for crystal growth according to claim 1, wherein said upper part can slide on said lower part while being moved in the horizontal direction, and said control means is a control rod for moving said upper part horizontally.

7. The apparatus for crystal growth according to claim 6, wherein the lower surface of said upper part is in contact with the surface of each substrate on which the liquid phase crystal growth is to be made, each substrate being held on said lower part, and when said upper part slides on said lower part, the separation of the growing solution from the grown surface after the crystal growth is effected by said upper part.

8. The apparatus for crystal growth according to claim 1, wherein said jig assembly means has a central plane and substantially rectangular shape and includes a middle part disposed between said upper and lower parts, said upper part and said lower part being fixed relative to each other so that said reservoir means may overlie said substrates said control means including said middle part and a control rod for horizontally moving said middle part, said middle part having at least one open passage extending vertically therethrough, the upper surface and lower surface of said middle part being, respectively, held in close contact with the lower surface of said upper part and the upper surface of said lower part, said upper surface of said middle part and another open passage provided in said upper part forming said reservoir means in a position other than a position for the growth, and said middle part being horizontally moved until said one passage comes under the another passage forming said reservoir means, so that said solution for the growth in said reservoir means falls down into said one passage and comes into contact with at least one substrate surface.

9. The apparatus for crystal growth according to claim 8, wherein the lower surface of said middle part is in contact with the surface of each substrate on which the liquid phase crystal growth is to be made, each substrate being held on said lower part, and when said middle part slides on said lower part, the separation of the growing solution from the grown surface after the crystal growth is effected by said middle part.

10. The apparatus for crystal growth according to claim 1, wherein said lower part includes means for positioning at least two of said substrates so that the surfaces of said two substrates on which the liquid phase crystal growth is to be made may lie in at least two different planes tangential to an identical isothermal plane.

11. The apparatus for crystal growth according to claim 1, wherein said upper part and said lower part are set relative to each other so that said reservoir means may overlie said substrates, said control means including a control rod for moving said upper part, said upper part having at least one open passage extending vertically therethrough, the upper surface of said lower part and lower surface of said upper part being held in close contact with each other, said upper surface of said lower part and the one passage provided in said upper part forming the reservoir means in a position of the jig assembly means other than the position for the crystal growth, and said upper part being capable of moving until said at least one open passage is over at least one substrate, so that said solution for the growth in said reservoir means comes into contact with the planar surface of at least one substrate.

12. An apparatus for crystal growth in the liquid phase comprising:

an electric furnace means for producing temperature differences vertically and for providing a plurality of isothermal curved planes vertically spaced from each other within said furnace;

a reactor defining a chamber which is within and is heated by said electric furnace;

a jig assembly means which is set in said reactor chamber and which includes an upper part and a lower part, the lower part being fixed and being arranged to hold on its upper surface a substrate, said lower part having means for positioning said substrate whereby a planar surface of said substrate on which the liquid phase crystal growth is to be made extends tangentially to an isothermal plane, and said planar surface is aslant with respect to any position perpendicular or parallel to the vertical axis of said jig assembly means or to the center line defined between the upper and lower parts of the jig assembly means, and the upper part having reservoir means for containing a solution for crystal growth; and control means to bring the solution for the growth in said reservoir means of said upper part into contact with said planar surface of said substrate and then to separate said solution and said planar surface.

* * * * *